United States Patent

Hilton

(10) Patent No.: US 8,200,729 B2
(45) Date of Patent: Jun. 12, 2012

(54) EFFICIENT IMPLEMENTATION OF FILTERS FOR MIMO FADING

(75) Inventor: Howard E. Hilton, Snohomish, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1210 days.

(21) Appl. No.: 11/552,896

(22) Filed: Oct. 25, 2006

(65) Prior Publication Data

US 2008/0104157 A1     May 1, 2008

(51) Int. Cl.
  *G06F 17/10* (2006.01)
  *G06F 17/17* (2006.01)
(52) U.S. Cl. ............... 708/316; 708/301; 708/313
(58) Field of Classification Search ............ 708/300, 708/313, 315–316, 321, 420
  See application file for complete search history.

(56) References Cited

U.S. PATENT DOCUMENTS

| | | | | |
|---|---|---|---|---|
| 3,679,882 | A * | 7/1972 | McAuliffe | 708/323 |
| 4,899,301 | A * | 2/1990 | Nishitani et al. | 708/404 |
| 5,262,972 | A * | 11/1993 | Holden et al. | 708/316 |
| 6,014,682 | A * | 1/2000 | Stephen et al. | 708/313 |
| 7,027,536 | B1 * | 4/2006 | Al-Dhahir | 375/347 |
| 7,093,204 | B2 * | 8/2006 | Oktem et al. | 716/1 |
| 7,327,700 | B2 * | 2/2008 | Venkatesh et al. | 370/326 |
| 7,502,816 | B2 * | 3/2009 | Kumamoto et al. | 708/405 |

OTHER PUBLICATIONS

"Quixilica Programmable Multi-Channel FIR Filter Module", QuinetiQ, 2002, available from http://www.eonic.co.kr/data/datasheet/transtech/FPGA/qx_fir.pdf.*

"HSP43168 Configured to Perform Multi-Channel Filtering", Application Note AN9421, Intersil, May 1998, available from www.intersil.com/data/an/an9421.pdf.*

* cited by examiner

*Primary Examiner* — Lewis A Bullock, Jr.
*Assistant Examiner* — Matthew Sandifer

(57) ABSTRACT

A single finite impulse response filter designed to operate on a single signal is used in conjunction with an input multiplexer that interleaves samples from multiple signals and an output decimator. The output of the decimator contains interleaved samples of the multiple signals with independent filtering applied to each.

18 Claims, 2 Drawing Sheets

EFFICIENT IMPLEMENTATION OF FILTERS FOR MIMO FADING

BACKGROUND

Multi-path fading is a contributing factor to microwave radio receiver error rates. Its effects can be reduced by employing transmitters with multiple outputs and receivers with multiple inputs. Simulating the dynamic multi-path fading behavior of such multi-input, multi-output (MIMO) communication channels is necessary to properly characterize the microwave radio equipment.

The most general linear model for a MIMO multi-path fader is shown in FIG. 1. Each Filter (m,n) block represents a time varying filter. Any set of band limited signals can be down converted and sampled so the filtering may be applied using a discrete time digital filter operating on a complex (I/Q) data sequence. Generally, each filter is implemented as an independent Finite Impulse Response (FIR) filter with time-varying complex coefficients (taps). After filtering, the signals can be up-converted and reconstructed as continuous time waveforms.

The key parameters associated with this multi-path fader are: the number of input and output channels supported, the filter sample rate, the number of taps in each filter, the maximum rate at which the filter taps can be updated, and the precision of the filter math.

SUMMARY

A MIMO multi-path fader can be constructed using a single finite impulse response filter designed to operate on a single signal in conjunction with an input multiplexer that interleaves samples from multiple signals and an output decimator. The output of the decimator contains interleaved samples of the multiple signals with independent filtering applied to each.

DETAILED DESCRIPTION

Figure 1:
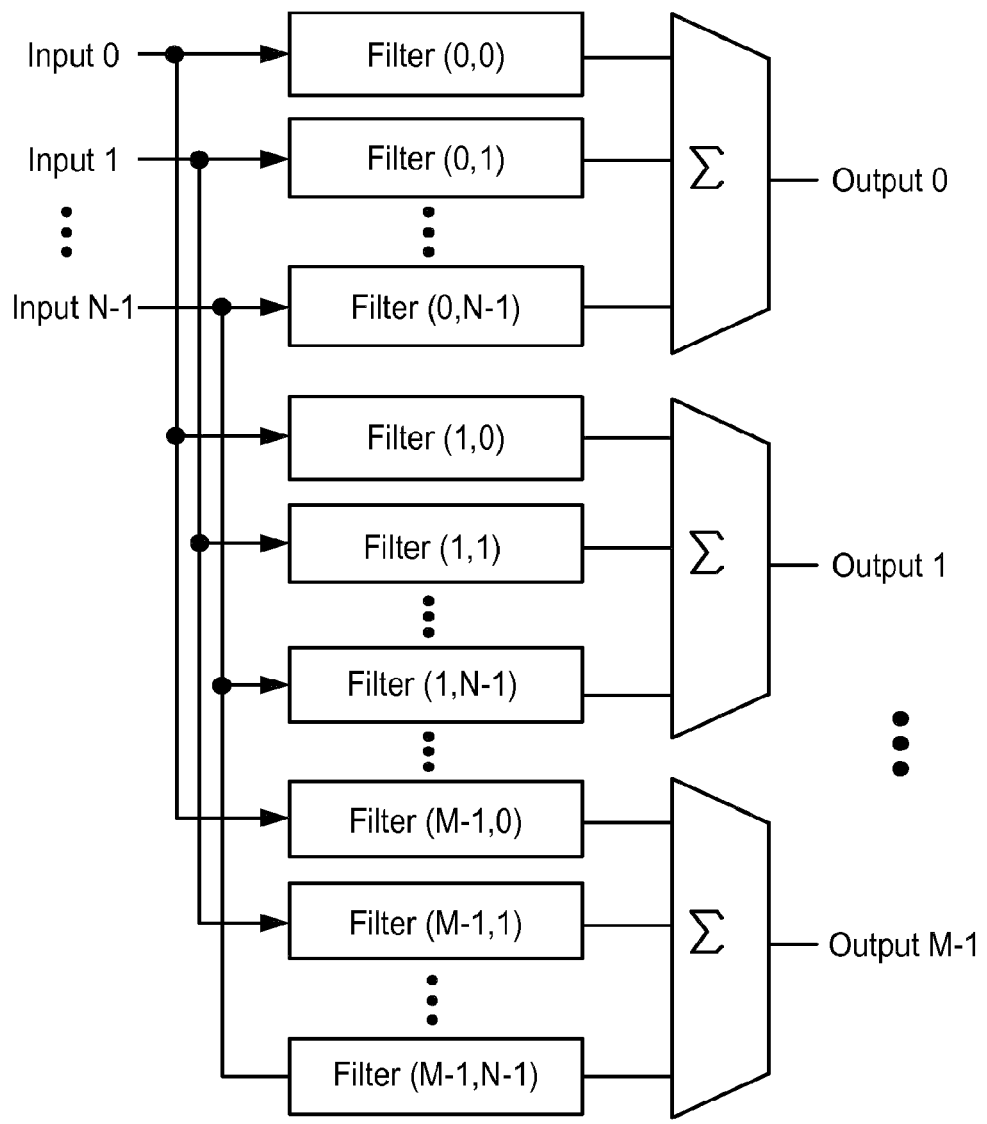
FIG. 1 illustrates a functional block diagram of prior art multi-path fader.
Figure 2:
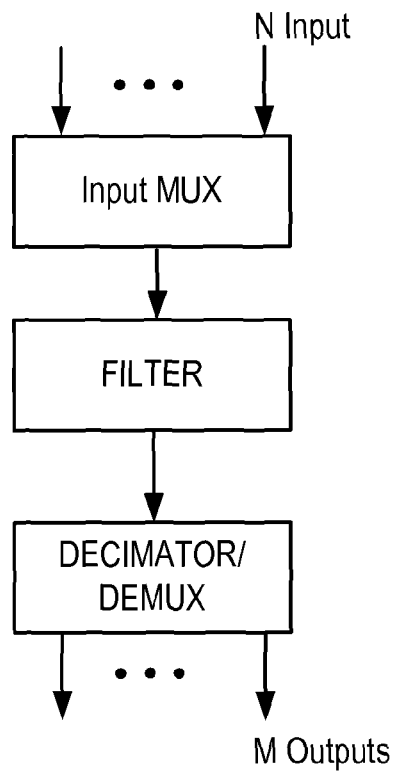
FIG. 2 illustrates a functional block diagram according to the present invention.

FIG. 2 illustrates a functional block diagram of a multi-path fader according to the present invention. A multi-path fader can be constructed using a single finite impulse response (FIR) filter designed to operate on a single signal in conjunction with an input multiplexer that interleaves samples from multiple signals and an output decimator. The output of the decimator (implemented as a demultiplexor) contains interleaved samples of the multiple signals with independent filtering applied to each.

The input multiplexer implements the data interleave pattern (shown in Table 1) used to emulate all six filters of a 3-input, 2-output MIMO system in a single FIR filter. The top row shows the composite tap sequence where each $c_{m,n,k}$ is the $k^{th}$ tap from filter (m,n). The subsequent rows show the corresponding data alignment versus clock cycle, where $x_{n,r}$ is the $r^{th}$ sample of input n. New data enters at the left and is shifted right one column per clock interval. The right column shows outputs computed as the inner product of that row with the taps, where $y_{m,r}$ is the $r^{th}$ sample of output m.

TABLE 1

Interleaved Taps/Data for a 3 × 2 MIMO composite filter

| $c_{0,0,k}$ | $c_{1,0,k}$ | $c_{0,1,k}$ | $c_{1,1,k}$ | $c_{0,2,k}$ | $c_{1,2,k}$ | $c_{0,0,k+1}$ | $c_{1,0,k+1}$ | |
|---|---|---|---|---|---|---|---|---|
| $X_{2,r}$ | 0 | $X_{0,r-1}$ | 0 | $X_{1,r-1}$ | 0 | $X_{2,r-1}$ | 0 | (none) |
| 0 | $X_{2,r}$ | 0 | $X_{0,r-1}$ | 0 | $X_{1,r-1}$ | 0 | $X_{2,r-1}$ | (none) |
| $X_{1,r}$ | 0 | $X_{2,r}$ | 0 | $X_{0,r-1}$ | 0 | $X_{1,r-1}$ | 0 | (none) |
| 0 | $X_{1,r}$ | 0 | $X_{2,r}$ | 0 | $X_{0,r-1}$ | 0 | $X_{1,r-1}$ | (none) |
| $X_{0,r}$ | 0 | $X_{1,r}$ | 0 | $X_{2,r}$ | 0 | $X_{0,r-1}$ | 0 | $y_{0,r}$ |
| 0 | $X_{0,r}$ | 0 | $X_{1,r}$ | 0 | $X_{2,r}$ | 0 | $X_{0,r-1}$ | $y_{1,r}$ |

The filter tap pattern from Table-1 may be generalized to any number of inputs, outputs, and taps by using the algebraic representation in Equation 1, where N is the number of inputs, M is the number of outputs, K is the number of taps in each filter. The $c_i'$ values are the taps of the composite filter with interleaved coefficients, where $0 \leq i < KNM$.

$$c_i' = c_{m,n,k}, i = kNM + nM + m, 0 \leq n < N, 0 \leq m < M, 0 \leq k < K \quad \text{Equation (1)}$$

The input sequence, $x_j'$, for the generalized composite filter is derived from the N individual input sequences as shown in equation-2, where $x_{n,r}$ is the $r^{th}$ sample of input n.

$$x_j' = \begin{cases} x_{N-1-(j \bmod NM)/M, \text{Floor}(j/NM)}, & \text{when } j \bmod M = 0 \\ 0 & \text{otherwise} \end{cases} \quad \text{Equation (2)}$$

The output decimator extracts the individual multiple sample outputs from the composite filter output sequence $y_p'$ using Equation 3, where $y_{m,r}$ is the $r^{th}$ sample of output m. All outputs failing the stated condition are discarded.

$$y_{p \bmod MN, \text{Floor}(p/MN)} = y_p', p \bmod MN < M \quad \text{Equation (3)}$$

The relative alignment of the composite input index, j, in Equation 2 and the output index, p, in Equation 3 must be appropriately defined. This is accomplished by assigning the p=0 index to the inner product computed when the j=M(N−1) input sample (i.e. $x_{0,0}$) is aligned with the first composite filter tap (i=0).

Figure 3:
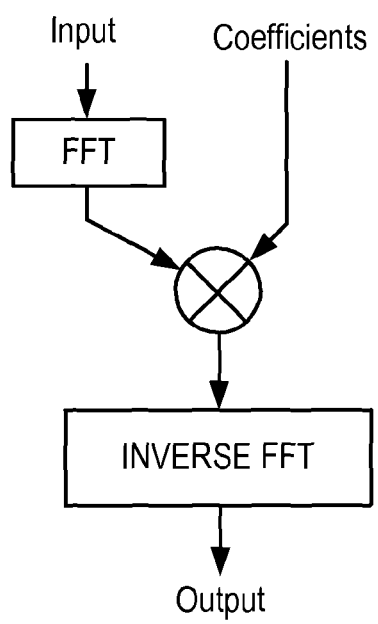
FIG. 3 illustrates an efficient implementation of a single channel finite impulse response (FIR) filter by transforming to the frequency domain, multiplying, and transforming back to the time domain.

From the preceding formulas, the single composite filter must have M times N as many taps as the individual filters, and its computational rate is increased by the same factor. This is an acceptable tradeoff when a single, high-speed, long tap-count filter is more efficiently implemented than multiple smaller filters. At this point, digital signal processing techniques, such as that disclosed by Oppenheim and Schafer in "Discrete-Time Signal Processing," Prentice Hall, 1989, Section 8.9, Linear Convolution Using the Discrete Fourier Transform, pp 548-561, can be applied to the signal to improve computational efficiency. To illustrate, the real or complex filter coefficients may be transformed from the time domain to the frequency domain via a Fast Fourier Transform (FFT), multiplied, and then transformed from the frequency domain to the time domain via an inverse FFT (as shown in FIG. 3).

I claim:

1. A circuit comprising:
    an input multiplexer that interleaves samples from a plurality of input signals, and provides a multiplexed signal;
    a single composite finite impulse response filter configured to operate on a single signal, and to provide a filter output sequence, the single composite finite impulse response filter receiving the multiplexed signal as the single signal; and a decimator with a demultiplexer, configured to receive the filter output sequence and to perform decimation of the filter output sequence to extract a plurality of output signals, wherein each of the plurality of output signals comprises a sum of a plurality of filtered signals, wherein the plurality of filtered signals comprise the plurality of input signals with a corresponding plurality of filtering operations performed thereon such that each output signal is a function of the plurality of input signals, and wherein a first one of the filtering operations performed of a first one of the input signals for producing a first one of the output signals is independent of a second one of the filtering operations performed on the first one of the input signals for producing a second one of the output signals, and wherein the single composite finite impulse response filter comprises a shift register having a number of taps equal to the number of input signals multiplied by the number of output signals and further multiplied by a number of filter coefficients employed for one of the independent filtering operations.

2. A circuit, as in claim 1, wherein the single composite finite impulse response filter sequentially:

transforms blocks of the single signal from the time domain into the frequency domain;

multiplies the transformed blocks by frequency domain coefficients to produce filtered blocks; and transforms the filtered blocks from the frequency domain to the time domain.

3. A circuit, as in claim 2, wherein each block of the single signal is multiplied by a unique set of the frequency domain coefficients.

4. A circuit, as in claim 2, wherein the frequency domain coefficients are Fourier transforms of interleaved time domain coefficients.

5. A circuit as in claim 4 wherein the time domain filter coefficients are complex.

6. The circuit of claim 1, wherein the single composite finite impulse response filter employs a total number of individual filter coefficients equal to the number of input signals multiplied by the number of output signals and further multiplied by a number of filter coefficients employed for one of the filtering operations.

7. The circuit of claim 1, wherein the single composite finite impulse response filter employs a plurality of filter coefficients equal to the number of taps of the shift register, wherein a corresponding one of the filter coefficients is applied to each tap, and wherein the corresponding filter coefficient applied to each tap while the first one of the filtering operations is performed is the same as the corresponding filter coefficient applied to each tap while the second one of the filtering operations is performed.

8. The circuit of claim 1, wherein the single composite finite impulse response filter employs a plurality of filter coefficients, and wherein filter coefficients employed in the first one of the filtering operations performed on the first one of the input signals for the first one of the output signals are independent of the filter coefficients employed in the second one of the filtering operations performed on the first one of the input signals for the second one of the output signals.

9. The circuit of claim 1, wherein the output sequence includes samples that do not belong to any of the output signals, and wherein the decimator discards the samples of the output sequence that do not belong to any of the output signals.

10. A method, comprising:

interleaving samples from a plurality of input signals to produce a multiplexed signal;

applying the multiplexed signal to a single composite finite impulse response filter configured to operate on a single signal, and to provide a filter output sequence, the single composite finite impulse response filter receiving the multiplexed signal as the single signal; and performing decimation, including demultiplexing, of the filter output sequence to extract multiple output signals, wherein each of the multiple output signals comprises a sum of filtered signals, wherein the plurality of filtered signals comprise the plurality of input signals with a corresponding plurality of filtering operations performed thereon such that each output signal is a function of the plurality of input signals, and wherein a first one of the filtering operations performed on a first one of the input signals for producing a first one of the output signals is independent of a second one of the filtering operations performed on the first one of the input signals for producing a second one of the output signals, and wherein the single composite finite impulse response filter comprises a shift register having a number of taps equal to the number of input signals multiplied by the number of output signals and further multiplied by a number of filter coefficients employed for one of the independent filtering operations.

11. The method of claim 10, wherein the single composite finite impulse response filter sequentially:

transforms blocks of the single signal from the time domain into the frequency domain;

multiplies the transformed blocks by frequency domain coefficients to produce filtered blocks; and transforms the filtered blocks from the frequency domain to the time domain.

12. The method of claim 11, wherein each block of the single signal is multiplied by a unique set of the frequency domain coefficients.

13. The method of claim 11, wherein the frequency domain coefficients are Fourier transforms of interleaved time domain coefficients.

14. The method of claim 13, wherein the time domain filter coefficients are complex.

15. The method of claim 10, wherein the single composite finite impulse response filter employs a total number of individual filter coefficients equal to the number of input signals multiplied by the number of output signals and further multiplied by a number of filter coefficients employed for one of the filtering operations.

16. The method of claim 10, wherein the single composite finite impulse response filter employs a plurality of filter coefficients equal to the number of taps of the shift register, wherein the method comprises applying a corresponding one of the filter coefficients to each tap, and wherein the corresponding filter coefficient applied to each tap while the first one of the filtering operations is performed is the same as the corresponding filter coefficient applied to each tap while the second one of the filtering operations is performed.

17. The method of claim 10, wherein the single composite finite impulse response filter employs a plurality of filter coefficients, and wherein filter coefficients employed in the first one of the filtering operations performed on the first one of the input signals for the first one of the output signals are independent of the filter coefficients employed in the second one of the filtering operations performed on the first one of the input signals for the second one of the output signals.

18. The method of claim 10, wherein the output sequence includes samples that do not belong to any of the output signals, and wherein the method includes the decimator discarding the samples of the output sequence that do not belong to any of the output signals.

* * * * *

UNITED STATES PATENT AND TRADEMARK OFFICE
CERTIFICATE OF CORRECTION

PATENT NO. : 8,200,729 B2
APPLICATION NO. : 11/552896
DATED : June 12, 2012
INVENTOR(S) : Howard E. Hilton Page 1 of 1

It is certified that error appears in the above-identified patent and that said Letters Patent is hereby corrected as shown below:

On the Title page, in field (56), under "Other Publications", in column 2, line 2, delete "QuinetiQ," and insert -- QinetiQ, --, therefor.

In column 3, line 15, in Claim 1, delete "performed of" and insert -- performed on --, therefor.

Signed and Sealed this
Thirty-first Day of July, 2012

David J. Kappos
*Director of the United States Patent and Trademark Office*